United States Patent
Xu et al.

(10) Patent No.: US 12,374,552 B2
(45) Date of Patent: Jul. 29, 2025

(54) METHODS FOR PREPARING SMALL FEATURES ON A SUBSTRATE

(71) Applicant: Applied Materials, Inc., Santa Clara, CA (US)

(72) Inventors: Yongan Xu, Santa Clara, CA (US); Wei Wu, Santa Clara, CA (US); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 449 days.

(21) Appl. No.: 17/989,557

(22) Filed: Nov. 17, 2022

(65) Prior Publication Data
US 2023/0253206 A1    Aug. 10, 2023

Related U.S. Application Data

(60) Provisional application No. 63/299,641, filed on Jan. 14, 2022.

(51) Int. Cl.
*H01L 21/033* (2006.01)

(52) U.S. Cl.
CPC ...... *H01L 21/0338* (2013.01); *H01L 21/0335* (2013.01); *H01L 21/0337* (2013.01)

(58) Field of Classification Search
CPC ............. H01L 21/0335; H01L 21/0337; H01L 21/0338
See application file for complete search history.

(56) References Cited

U.S. PATENT DOCUMENTS

| | | | |
|---|---|---|---|
| 7,534,723 B2 | 5/2009 | Park et al. | |
| 7,554,734 B1 | 6/2009 | Holm et al. | |
| 8,008,163 B2 | 8/2011 | Jang et al. | |
| 9,513,480 B2 | 12/2016 | Saarikko et al. | |
| 9,726,794 B2 | 8/2017 | Boyraz | |
| 10,867,794 B2 | 12/2020 | Chang et al. | |
| 2007/0059934 A1 | 3/2007 | Park et al. | |
| 2010/0177388 A1 | 7/2010 | Cohen et al. | |
| 2011/0034004 A1 | 2/2011 | Jang et al. | |
| 2011/0039413 A1 | 2/2011 | Akinmade-Yusuff et al. | |
| 2016/0148808 A1* | 5/2016 | Kim ................. | H01L 21/32139 438/587 |

(Continued)

FOREIGN PATENT DOCUMENTS

| | | |
|---|---|---|
| CN | 102272643 B | 10/2013 |
| KR | 20060076498 A | 7/2006 |
| WO | 2016/141372 A1 | 9/2016 |

OTHER PUBLICATIONS

International Search Report and Written Opinion dated Mar. 22, 2023 for Application No. PCT/US2022/050318.

(Continued)

*Primary Examiner* — Walter H Swanson
(74) *Attorney, Agent, or Firm* — Patterson + Sheridan, LLP

(57) ABSTRACT

Embodiments of the present disclosure generally relate to methods for forming features having small and large line widths on the same substrate or device. In some embodiments, the methods described and discussed herein can be used to produce optical and photonic devices. These devices, including augmented reality (AR) devices and/or virtual reality (VR) devices, have desired pattern areas with different features and/or line widths to achieve the desired optical performance.

20 Claims, 4 Drawing Sheets

(56) References Cited

U.S. PATENT DOCUMENTS

| | | |
|---|---|---|
| 2016/0327705 A1 | 11/2016 | Simmonds et al. |
| 2017/0168209 A1 | 6/2017 | Shin et al. |
| 2018/0292653 A1 | 10/2018 | Tervo |
| 2020/0003936 A1 | 1/2020 | Fu et al. |
| 2020/0312662 A1 | 10/2020 | Chang et al. |
| 2020/0409151 A1 | 12/2020 | Calafiore |

OTHER PUBLICATIONS

PCT Notification of Transmittal of the International Search Report and the Written Opinion of the International Searching Authority for International Application No. PCT/US2018/057096; dated Mar. 11, 2019; 19 total pages.

Taiwanese Office Action dated Oct. 8, 2019, for Taiwanese Patent Application No. 107137673, 7 pages.

PCT Written Opinion of the International Searching Authority for International Application No. PCT/US2022/012523; dated May 6, 2022.

\* cited by examiner

METHODS FOR PREPARING SMALL FEATURES ON A SUBSTRATE

CROSS-REFERENCE TO RELATED APPLICATIONS

This application claims benefit to U.S. Appl. No. 63/299,641, filed on Jan. 14, 2022, which is herein incorporated by reference.

BACKGROUND

Field

Embodiments of the present disclosure generally relate to photoresist technology, and more specifically, relate to methods for preparing features on a substrate.

Description of the Related Art

Optical and photonic devices, integrated circuits, and other microelectronic devices have evolved into complex devices that can include millions of design features and/or components (e.g., transistors, capacitors and resistors) on a single substrate, chip, and/or other device. Photolithography may be used to form features, lines, and/or components on the substrate or chip. Generally the process of photolithography includes forming a photoresist (PR) layer on a substrate, patterning the PR layer, and removing material based on the patterned PR layer.

In the field of optics, optical and photonic devices may be used to manipulate the propagation of light by spatially varying structural patterns of the optical or photonic devices formed on a substrate. In some optical and photonic devices, the desired pattern area will have different line widths to achieve the desired optical performance. Such devices include an augmented reality (AR) device or a virtual reality (VR) device. Patterns with different line widths can be difficult to work with because while etching or otherwise removing material on one portion of a substrate, material in another portion of the substrate may inadvertently be etched too much and damaged. For example, when features with relatively wider widths are being intentionally etched, other features with thinner widths may be simultaneously and overly etched. Such over etching to the thinner width features may cause issues which includes too thin lines, line wiggle, line flop, line breaks, line completely removed, and/or features which have too large of line edge roughness (LER).

Therefore, there is a need for an improved method to prepare features which have both small and large line widths.

SUMMARY

Embodiments of the present disclosure generally relate to methods for forming features having small and large line widths on the same substrate or device. In some embodiments, the methods described and discussed herein can be used to produce optical and photonic devices. These devices, including augmented reality (AR) devices and/or virtual reality (VR) devices, have desired pattern areas with different features and/or line widths to achieve the desired optical performance.

In one or more embodiments, a method for forming features on a workpiece is provided and includes positioning the workpiece containing a film stack disposed on a substrate. The film stack contains a hard mask layer disposed on the substrate, a planarization layer disposed on the hard mask layer, a silicon-containing layer disposed on the planarization layer, and a patterned photoresist layer disposed on the silicon-containing layer. The patterned photoresist layer contains a first pattern having a first width and a second pattern having a second width less than the first width. The method also includes etching the silicon-containing layer to form trenches extending through the silicon-containing layer and to the planarization layer during a first etching process. The trenches are formed on exposed surfaces of the silicon-containing layer within spaces between the first and second patterns of the patterned photoresist layer. A first set of features corresponding to the first pattern and a second set of features corresponding to the second pattern are formed in the silicon-containing layer. The silicon-containing layer has the first width in the first set of features and the second width in the second set of features after the first etching process. The method further includes etching the planarization layer to further extend the trenches to the hard mask layer during a second etching process. The first set of features corresponding to the first pattern and the second set of features corresponding to the second pattern are further formed in the planarization layer during the second etching process. The planarization layer has the first width in the first set of features and the second width in the second set of features after the second etching process. The method also includes etching the hard mask layer to further extend the trenches to the substrate during a third etching process. The first set of features corresponding to the first pattern and the second set of features corresponding to the second pattern are further formed in the hard mask layer during the third etching process. The hard mask layer has the first width in the first set of features and the second width in the second set of features after the third etching process. The planarization layer has a third width in the first set of features and a fourth width in the second set of features after the third etching process. The third width is less than the first width and the fourth width is less than the second width. The method further includes removing the silicon-containing layer from the planarization layer during a fourth etching process or a polishing process, depositing a silicon oxide layer over the planarization layer and the hard mask layer within the first set of features and the second set of features, and depositing a protective layer over the first set of features while leaving exposed the second set of features. The method also includes exposing the second set of features to a fifth etching process to remove the silicon oxide layer from the second set of features and remove a portion of the hard mask layer within the second set of features. The hard mask layer within the second set of features has the fourth width after the fifth etching process. The method further includes exposing the first set of features to a sixth etching process to remove the protective layer from the first set of features, remove the silicon oxide layer from the first set of features, remove a portion of the hard mask layer within the first set of features, and remove the planarization layer within the first set of features and the second set of features. The hard mask layer within the first set of features has the third width after the sixth etching process.

In other embodiments, a method for forming features on a workpiece is provide and includes positioning the workpiece containing a first set of features having a first pattern and a second set of features having a second pattern are formed in the silicon-containing layer, wherein each of the first set of features and the second set of features contains a film stack disposed on a substrate. The film stack contains a hard mask layer disposed on the substrate, a planarization layer disposed on the hard mask layer, and a silicon-containing layer disposed on the planarization layer. The hard mask layer and the silicon-containing layer in the first set of features have a first width. The hard mask layer and the silicon-containing layer in the second set of features have a second width. The planarization layer in the first set of features has a third width. The planarization layer in the second set of features has a fourth width. The second width is less than the first width, the fourth width is less than the third width, the third width is less than the first width, and the fourth width is less than the second width. The method further includes removing the silicon-containing layer from the planarization layer, depositing a silicon oxide layer over the planarization layer and the hard mask layer within the first set of features and the second set of features, and depositing a protective layer over the first set of features while leaving exposed the second set of features. The method also includes removing the silicon oxide layer from the second set of features and removing a portion of the hard mask layer within the second set of features, where the hard mask layer within the second set of features has the fourth width after removing the portion of the hard mask layer. The method further includes removing the protective layer from the first set of features, removing the silicon oxide layer from the first set of features, removing a portion of the hard mask layer within the first set of features, and removing the planarization layer within the first set of features and the second set of features, where the hard mask layer within the first set of features has the third width after removing the portion of the hard mask layer.

In some embodiments, a method for forming features on a workpiece is provide and includes positioning the workpiece containing a film stack disposed on a substrate, wherein the film stack contains a hard mask layer disposed on the substrate, a planarization layer disposed on the hard mask layer, a silicon-containing layer disposed on the planarization layer, and a patterned photoresist layer disposed on the silicon-containing layer. The patterned photoresist layer contains a first pattern having a first width and a second pattern having a second width less than the first width. The method further includes etching the silicon-containing layer to form trenches extending through the silicon-containing layer and to the planarization layer during a first etching process, wherein the trenches are formed on exposed surfaces of the silicon-containing layer within spaces between the first and second patterns of the patterned photoresist layer, wherein a first set of features corresponding to the first pattern and a second set of features corresponding to the second pattern are formed in the silicon-containing layer, and wherein the silicon-containing layer has the first width in the first set of features and the second width in the second set of features after the first etching process. The method also includes etching the planarization layer to further extend the trenches to the hard mask layer during a second etching process, wherein the first set of features corresponding to the first pattern and the second set of features corresponding to the second pattern are further formed in the planarization layer during the second etching process, and wherein the planarization layer has the first width in the first set of features and the second width in the second set of features after the second etching process. The method also includes etching the hard mask layer to further extend the trenches to the substrate during a third etching process, wherein the first set of features corresponding to the first pattern and the second set of features corresponding to the second pattern are further formed in the hard mask layer during the third etching process, wherein the hard mask layer has the first width in the first set of features and the second width in the second set of features after the third etching process, wherein the planarization layer has a third width in the first set of features and a fourth width in the second set of features after the third etching process, and wherein the third width is less than the first width and the fourth width is less than the second width. The method further includes removing the silicon-containing layer from the planarization layer during a fourth etching process or a polishing process, depositing a silicon oxide layer over the planarization layer and the hard mask layer within the first set of features and the second set of features, and depositing a protective layer over the first set of features while leaving exposed the second set of features. The protective layer contains a g-line photoresist material, an i-line photoresist material, a photoresist material which develops at a wavelength of 248 nm, a photoresist material which develops at a wavelength of 193 nm, a BARC material, or any combination thereof. The method further includes exposing the second set of features to a fifth etching process to remove the silicon oxide layer from the second set of features and remove a portion of the hard mask layer within the second set of features, wherein the hard mask layer within the second set of features has the fourth width after the fifth etching process. The method also includes exposing the first set of features to a sixth etching process to remove at least a portion of the hard mask layer within the first set of features, wherein the hard mask layer within the first set of features has the third width after the sixth etching process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to methods for forming various features having small and large line widths on the same substrate or device. In some embodiments, the methods described and discussed herein can be used to produce optical and photonic devices. These devices, including augmented reality (AR) devices and/or virtual reality (VR) devices, have desired pattern areas with different features and/or line widths to achieve the desired optical performance.

FIGS. 1A-1I depict cross-sectional views of a workpiece 100 at different stages of a method for preparing or forming patterns 152a, 152b having both relatively small and large line widths. FIG. 2 is a flow chart depicting different operations of a method 200 which can be used to process the workpiece 100 depicted at different stages, as described and discussed in one or more embodiments herein. The method 200 includes operations 205-245 as further described and discussed herein.

Figure 1A:
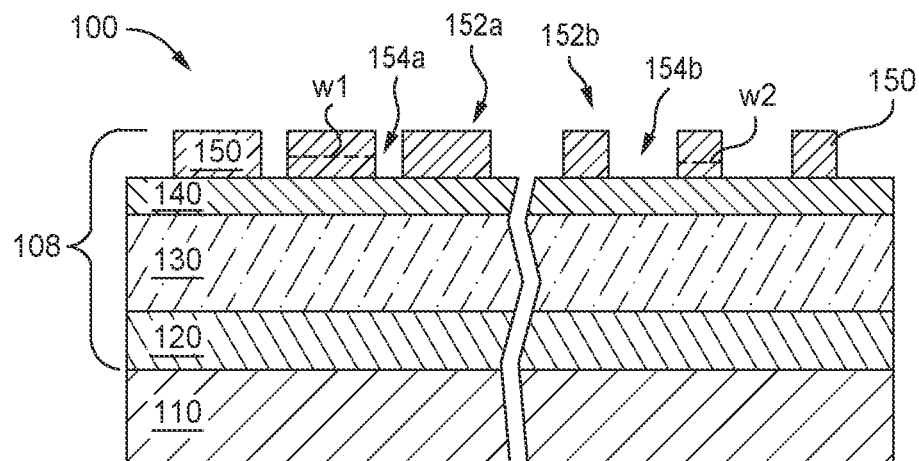
FIGS. 1A-1I depict cross-sectional views of workpiece at different stages of a method for forming features having relatively small and large line widths, as described and discussed in one or more embodiments herein.
Figure 2:
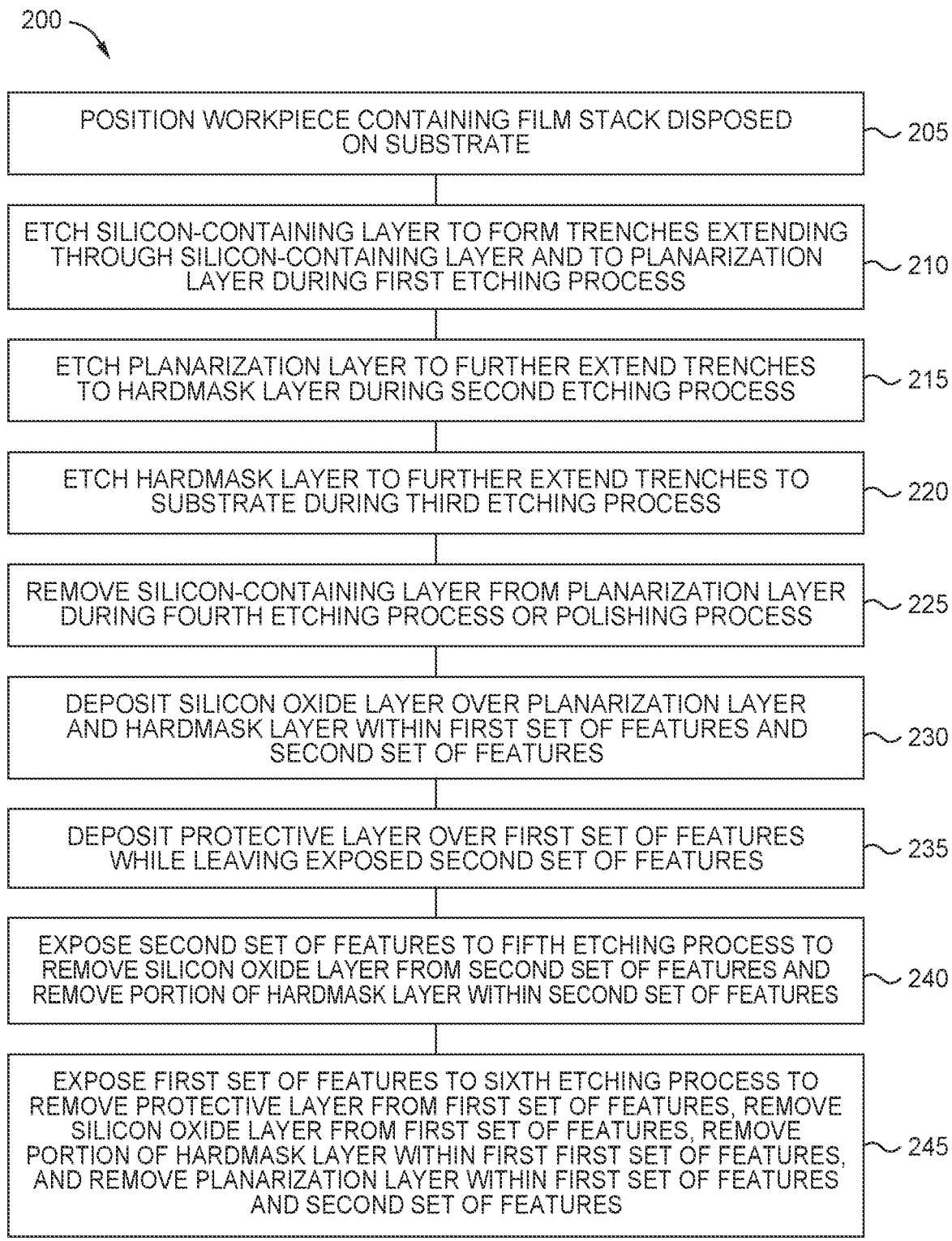
FIG. 2 is a flow chart depicting different operations of a method for processing the workpiece depicted in FIGS. 1A-1I, as described and discussed in one or more embodiments herein.

FIG. 1A depicts the workpiece 100 containing a film stack 108 disposed on a substrate 110. The film stack 108 contains a hard mask layer 120 disposed on the substrate 110, a planarization layer 130 disposed on the hard mask layer 120, a silicon-containing layer 140 disposed on the planarization layer 130, and a patterned photoresist (PR) layer 150 disposed on the silicon-containing layer 140.

The substrate 110 may be formed from any suitable material, provided that the substrate 110 can adequately transmit light in a desired wavelength or wavelength range and can serve as an adequate support for the optical device 100A and the optical device 100B, described herein. In some embodiments, which can be combined with other embodiments described herein, the material of the substrate 110 has a refractive index that is relatively low, as compared to the refractive index of the plurality of optical device structures 102. Substrate selection may include substrates of any suitable material, including, but not limited to, amorphous dielectrics, non-amorphous dielectrics, crystalline dielectrics, silicon oxide, polymers, and combinations thereof. In some embodiments, which may be combined with other embodiments described herein, the substrate 110 includes a transparent material. The substrate 110 can be or include elemental silicon, one or more silicon oxides, silicon dioxide, doped-silicon oxide, fused silica, quartz, glass, one or more high-index transparent materials (e.g., high-refractive-index glass), silicon carbide, germanium, silicon germanium, indium phosphide, gallium arsenide, gallium nitride, sapphire, diamond, dopants thereof, or any combination thereof.

The hard mask layer 120 can be deposited, formed, placed, or otherwise disposed on or over the substrate 110. The hard mask layer 120 can be or include any material or layer for masking the substrate 110. In one or more examples, the hard mask layer 120 can be or include metallic chromium, titanium nitride, tantalum nitride, silicon nitride, titanium oxide, niobium oxide, alloys thereof, dopants thereof, or any combination thereof. In some examples, the hard mask layer 120 can be or include carbon, amorphous carbon, spin-on carbon (SOC), spin-on glass (SOG), silicon oxide, silicon oxynitride, dopants thereof, or any combination thereof. In one or more examples, the hard mask layer 120 can be or include one or more advanced patterning films (APFs). The hard mask layer 120 can be formed or otherwise produced by a CVD process, a PECVD process, and/or a spin-on process.

The hard mask layer 120 can have a thickness of about 10 nm, about 15 nm, about 20 nm, about 30 nm, about 40 nm, or about 50 nm to about 60 nm, about 80 nm, about 100 nm, about 120 nm, about 150 nm, about 180 nm, about 200 nm, about 250 nm, about 300 nm, about 400 nm, about 500 nm, or greater. For example, the hard mask layer 120 can have a thickness of about 10 nm to about 500 nm, about 10 nm to about 400 nm, about 10 nm to about 300 nm, about 10 nm to about 250 nm, about 10 nm to about 200 nm, about 10 nm to about 150 nm, about 10 nm to about 100 nm, about 10 nm to about 80 nm, about 10 nm to about 50 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 40 nm to about 300 nm, about 40 nm to about 250 nm, about 40 nm to about 200 nm, about 40 nm to about 150 nm, about 40 nm to about 100 nm, about 40 nm to about 80 nm, or about 40 nm to about 50 nm.

The planarization layer 130 can be deposited, formed, placed, or otherwise disposed on or over the hard mask layer 120. The planarization layer 130 can be or include any material or layer for forming a level or planar surface layer over the hard mask layer 120. In one or more examples, the planarization layer 130 can be or include one or more organic planarization layers (OPLs). The planarization layer 130 can be or include one or more polymeric materials, one or more oligomeric materials, titanium oxide, silicon oxide, spin-on carbon, or any combination thereof.

The planarization layer 130 can have a thickness of about 5 nm, about 10 nm, about 15 nm, about 20 nm, about 30 nm, about 40 nm, about 50 nm, about 60 nm, about 80 nm, or about 100 nm to about 120 nm, about 150 nm, about 180 nm, about 200 nm, about 250 nm, about 300 nm, about 400 nm, about 500 nm, about 600 nm, about 750 nm, or greater. For example, the planarization layer 130 can have a thickness of about 5 nm to about 750 nm, about 10 nm to about 500 nm, about 10 nm to about 400 nm, about 10 nm to about 300 nm, about 10 nm to about 250 nm, about 10 nm to about 200 nm, about 10 nm to about 150 nm, about 10 nm to about 100 nm, about 10 nm to about 80 nm, about 10 nm to about 50 nm, about 30 nm to about 300 nm, about 30 nm to about 250 nm, about 30 nm to about 200 nm, about 30 nm to about 150 nm, about 30 nm to about 100 nm, about 30 nm to about 80 nm, about 30 nm to about 50 nm, about 50 nm to about 300 nm, about 50 nm to about 250 nm, about 50 nm to about 200 nm, about 50 nm to about 150 nm, about 50 nm to about 100 nm, about 50 nm to about 80 nm, or about 50 nm to about 60 nm.

The silicon-containing layer 140 can be deposited, formed, placed, or otherwise disposed on or over the planarization layer 130. The silicon-containing layer 140 can be or include any material or layer for effecting the reflection or transmission of light waves. In one or more examples, the silicon-containing layer 140 can be or include one or more anti-reflection coating (ARC) layers, one or more silicon-ARC (Si-ARC) layers, one or more bottom ARC (BARC) layers, one or more dielectric ARC (DARC) layers, or other ARC layers. The silicon-containing layer 140 can be or include silicon oxide, silicon dioxide, elemental silicon, amorphous silicon, a tetraethoxysilane (TEOS) layer, or combinations thereof. The silicon-containing layer 140 can be deposited, formed, or otherwise produced by chemical vapor deposition (CVD) or plasma-enhanced CVD (PECVD).

The silicon-containing layer 140 can have a thickness of about 10 nm, about 15 nm, about 20 nm, about 30 nm, about 40 nm, or about 50 nm to about 60 nm, about 80 nm, about 100 nm, about 120 nm, about 150 nm, about 180 nm, about 200 nm, about 250 nm, about 300 nm, about 400 nm, about 500 nm, or greater. For example, the hard mask layer 120 can have a thickness of about 10 nm to about 500 nm, about 10 nm to about 400 nm, about 10 nm to about 300 nm, about 10 nm to about 250 nm, about 10 nm to about 200 nm, about 10 nm to about 150 nm, about 10 nm to about 100 nm, about 10 nm to about 80 nm, about 10 nm to about 50 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 40 nm to about 300 nm, about 40 nm to about 250 nm, about 40 nm to about 200 nm, about 40 nm to about 150 nm, about 40 nm to about 100 nm, about 40 nm to about 80 nm, or about 40 nm to about 50 nm.

The patterned PR layer 150 can be deposited, formed, placed, or otherwise disposed on or over the silicon-containing layer 140. The patterned PR layer 150 can be or include any material or layer used to pattern or dispose images, features, or other patterns onto one or more underlying layers, such as the silicon-containing layer 140, the planarization layer 130, the hard mask layer 120, the substrate 110, or other layers shown or not shown in the Figures.

The patterned PR layer 150 can be or include one or more PR materials, one or more PR layers, or any combination thereof. In one or more examples, the patterned PR layer 150 can be or include a mask or other patterned layer developed, prepared, or otherwise produced by one or multiple processes. In some examples, the patterned PR layer 150 is prepared by a lithography process, such as by an extreme ultraviolet (EUV) lithography process. In other examples, the patterned PR layer 150 can be porous and can have pores throughout the material including all surfaces of the patterned PR layer 150.

As shown in FIG. 1A, the workpiece 100 has two or more portions (collectively as 102) identified as a first portion 102a and a second portion 102b. The patterned PR layer 150 is depicted as having already been developed or patterned and contains a plurality of features or patterns 152a, 152b (collectively 152) formed within the patterned PR layer 150. The patterns 152a are within the first portion 102a of the workpiece 100 and the patterns 152b are within the second portion 102b of the workpiece 100. The patterns 152a are separated by spaces or trenches 154a and the patterns 152b are separated by spaces or trenches 154b. The patterns 152a, 152b are transcribed or otherwise transferred onto to the workpiece 100 to form corresponding features within the film stack 108 throughout the method 100.

The first pattern 152a has a first width (w1) and the second pattern 152b has a second width (w2), which is less than the first width (w1). The first width (w1) is the line thickness or the feature thickness within the first pattern 152a and the second width (w2) is the line thickness or the feature thickness within the second pattern 152b. As such, the first pattern 152a has wider or larger line or feature thicknesses than the second pattern 152b, or alternatively, the second pattern 152b has a thinner or smaller line or feature thicknesses than the first pattern 152a. Each of the first width (w1) and the second width (w2) can independently have any value of width or thickness, such that the second width (w2) is less than the first width (w1).

In one or more embodiments, the first width (w1) is 90 nm or greater and the second width (w2) is less than 90 nm. The first width (w1) can be 90 nm, about 95 nm, about 100 nm, about 110 nm, about 120 nm, about 150 nm, or about 180 nm to about 200 nm, about 220 nm, about 250 nm, about 280 nm, about 300 nm, about 400 nm, about 500 nm, or greater. For example, the first width (w1) can be about 90 nm to about 500 nm, about 100 nm to about 500 nm, about 100 nm to about 400 nm, about 100 nm to about 300 nm, about 100 nm to about 250 nm, about 100 nm to about 200 nm, about 100 nm to about 180 nm, about 100 nm to about 150 nm, about 100 nm to about 120 nm, about 150 nm to about 500 nm, about 150 nm to about 400 nm, about 150 nm to about 300 nm, about 150 nm to about 250 nm, about 150 nm to about 200 nm, about 150 nm to about 180 nm, about 150 nm to about 165 nm, about 200 nm to about 500 nm, about 200 nm to about 400 nm, about 200 nm to about 300 nm, or about 200 nm to about 250 nm. The second width (w2) can be less than 90 nm, such as about 1 nm, about 5 nm, about 10 nm, about 15 nm, about 20 nm, about 25 nm, or about 30 nm to about 40 nm, about 50 nm, about 60 nm, about 70 nm, about 80 nm, about 85 nm, or about 89 nm. For example, the second width (w2) can be about 1 nm to less than 90 nm, about 1 nm to about 89 nm, about 5 nm to about 85 nm, about 5 nm to about 80 nm, about 5 nm to about 60 nm, about 5 nm to about 50 nm, about 5 nm to about 40 nm, about 5 nm to about 30 nm, about 5 nm to about 25 nm, about 5 nm to about 20 nm, about 5 nm to about 15 nm, about 5 nm to about 10 nm, about 15 nm to less than 90 nm, about 15 nm to about 80 nm, about 15 nm to about 60 nm, about 15 nm to about 50 nm, about 15 nm to about 40 nm, about 15 nm to about 30 nm, about 15 nm to about 25 nm, about 15 nm to about 20 nm, about 25 nm to less than 90 nm, about 25 nm to about 80 nm, about 25 nm to about 60 nm, about 25 nm to about 50 nm, about 25 nm to about 40 nm, or about 25 nm to about 30 nm.

The method 200 is used to form or otherwise prepare features having small and large line widths on the substrate 110. At operation 205, the workpiece 100, as shown in FIG. 1A, can be introduced, moved, or otherwise positioned within a processing region while being processed with the method 200. The processing region may be a volume or an area within a processing chamber or processing system used to process wafers or substrates as described and discussed herein.

Figure 1B:
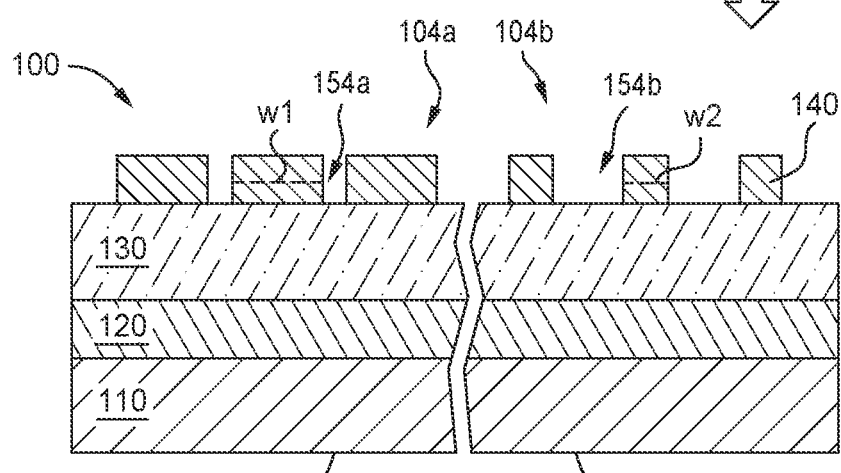

At operation 210, the silicon-containing layer 140 is etched or otherwise removed to further extend the trenches 154a, 154b from the patterned PR layer 150, extending through the silicon-containing layer 140 and to the planarization layer 130 during a first etching process, as depicted in FIG. 1B. The trenches 154a, 154b are formed on exposed surfaces of the silicon-containing layer 140 within spaces between the first and second patterns 152a, 152b of the patterned photoresist layer 150.

A first set of features 104a corresponding to the first pattern 152a and a second set of features 104b corresponding to the second pattern 152b are independently formed in the silicon-containing layer 140. After the first etching process, the silicon-containing layer 140 has the first width (w1) in the first set of features 104a within the first portion 102a and the silicon-containing layer 140 has the second width (w2) in the second set of features 104b within the second portion 102b. As the trenches 154a, 154b extend from the patterned PR layer 150 through the silicon-containing layer 140, the first width (w1) and the second width (w2) are respectively transferred to the silicon-containing layer 140 within the first and second portions 102a, 102b.

In one or more embodiments, the first etching process includes exposing the silicon-containing layer 140 to a reactive ion etch process. The silicon-containing layer 140 can be exposed to one or more etchants during the first etching process. The etchant can be or include trifluoromethane, tetrafluoromethane, methane, oxygen ($O_2$), hydrogen ($H_2$), helium, nitrogen ($N_2$), argon, ions thereof, plasmas thereof, or any combination thereof. The silicon-containing layer 140 can be exposed to one or more etchants for time period from a minimum value of about 10 seconds, about 15 seconds, about 20 seconds, or about 30 seconds to a maximum value of about 45 seconds, about 60 seconds, about 75 seconds, about 90 seconds, about 100 seconds, about 120 seconds, or longer during the first etching process. For example, the silicon-containing layer 140 can be exposed to the etchant for about 10 seconds to about 120 seconds, about 30 seconds to about 120 seconds, or about 10 seconds to about 60 seconds during the first etching process. An exemplary process chamber for conducting the first etching process is the Sym3™ chamber commercially available from Applied Materials, Inc.

In one or more examples, the patterned PR layer 150 can be removed from the silicon-containing layer 140 by an additional etching process and/or a polishing process after the first etching process. In other examples, the patterned PR layer 150 can be peeled from or lift-off the silicon-containing layer 140 after the first etching process. The etchant can be or include oxygen ($O_2$), hydrogen ($H_2$), helium, nitrogen ($N_2$), argon, ions thereof, plasmas thereof, or any combination thereof. The patterned PR layer 150 can be exposed to one or more etchants for time period from a minimum value of about 10 seconds, about 15 seconds, about 20 seconds, or about 30 seconds to a maximum value of about 45 seconds, about 60 seconds, about 75 seconds, about 90 seconds, about 100 seconds, about 120 seconds, or longer during the additional etching process. For example, the patterned PR layer 150 can be exposed to the etchant for about 10 seconds to about 120 seconds, about 30 seconds to about 120 seconds, or about 10 seconds to about 60 seconds during the additional etching process. An exemplary process chamber for conducting the additional etching process is the Sym3™ chamber commercially available from Applied Materials, Inc.

Figure 1C:
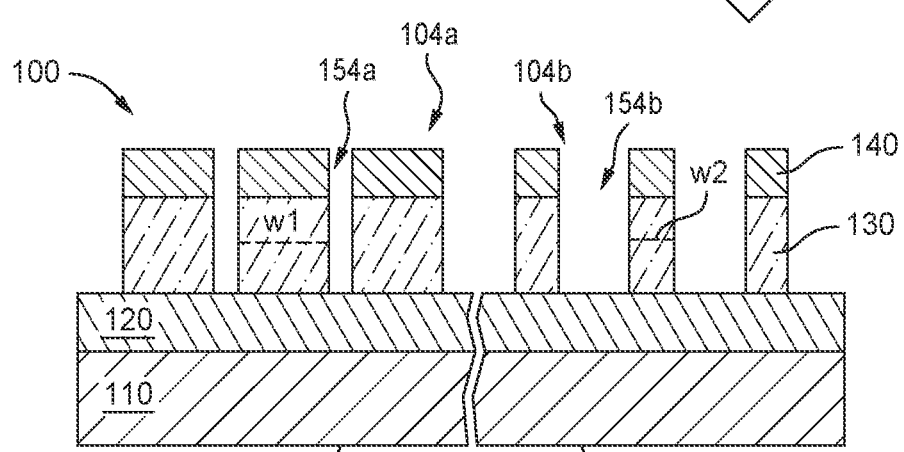

At operation 215, the planarization layer 130 is etched or otherwise removed to further extend the trenches 154a, 154b through the planarization layer 130 and to the hard mask layer 120 during a second etching process, as depicted in FIG. 1C. The first set of features 104a corresponding to the first pattern 152a and the second set of features 104b corresponding to the second pattern 152b are further formed in the planarization layer 130 during the second etching process. As the trenches 154a, 154b extend from the silicon-containing layer 140 through the planarization layer 130, the first width (w1) and the second width (w2) are respectively transferred to the planarization layer 130 within the first and second portions 102a, 102b.

In one or more embodiments, the second etching process includes exposing the planarization layer 130 to a reactive ion etch process. The planarization layer 130 is exposed to one or more etchants during the second etching process. The etchant can be or include oxygen ($O_2$), nitrogen ($N_2$), chlorine ($Cl_2$), hydrogen bromide, methane, hydrogen ($H_2$), ions thereof, plasmas thereof, or any combination thereof. The planarization layer 130 can be exposed to one or more etchants for time period from a minimum value of about 10 seconds, about 15 seconds, about 20 seconds, or about 30 seconds to a maximum value of about 45 seconds, about 60 seconds, about 75 seconds, about 90 seconds, about 100 seconds, about 120 seconds, or longer during the second etching process. For example, the planarization layer 130 can be exposed to the etchant for about 10 seconds to about 120 seconds, about 30 seconds to about 120 seconds, or about 10 seconds to about 60 seconds during the second etching process. An exemplary process chamber for conducting the second etching process is the Sym3™ chamber commercially available from Applied Materials, Inc.

Figure 1D:
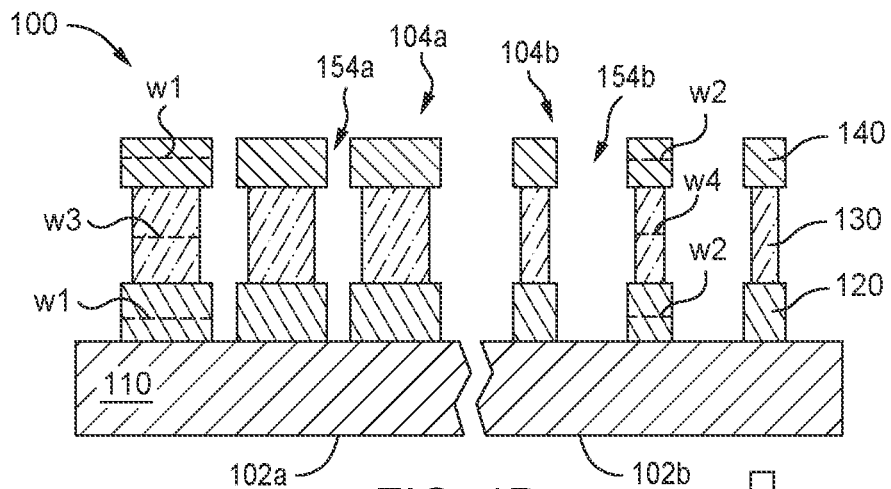

At operation 220, the hard mask layer 120 is etched or otherwise removed to further extend the trenches 154a, 154b through the hard mask layer 120 and to the substrate 110 during a third etching process, as depicted in FIG. 1D. The first set of features 104a corresponding to the first pattern 152a and the second set of features 104b corresponding to the second pattern 152b are further formed in the hard mask layer 120 during the third etching process. The hard mask layer 120 has the first width (w1) in the first set of features 104a and the second width (w2) in the second set of features 104b after the third etching process. As the trenches 154a, 154b extend from the silicon-containing layer 140 and/or the planarization layer 130 through the hard mask layer 120, the first width (w1) and the second width (w2) are respectively transferred to the hard mask layer 120 within the first and second portions 102a, 102b.

In addition, the planarization layer 130 is further etched during the third etching process. As such, the planarization layer 130 has a third width (w3) in the first set of features 104a and a fourth width (w4) in the second set of features 104b after the third etching process. The third width (w3) is less than the first width (w1) and the fourth width (w4) is less than the second width (w2). Each of the W1/W3 ratio and the W2/W4 ratio can independently be about 1.05, about 1.1, about 1.15, about 1.2, about 1.25, about 1.3, about 1.35, about 1.4, about 1.45, about 1.5, or greater. For example, each of the W1/W3 ratio and the W2/W4 ratio can independently be about 1.05 to about 1.5, about 1.05 to about 1.45, about 1.05 to about 1.4, about 1.05 to about 1.35, about 1.05 to about 1.3, about 1.05 to about 1.25, about 1.05 to about 1.2, about 1.1 to about 1.5, about 1.1 to about 1.45, about 1.1 to about 1.4, about 1.1 to about 1.35, about 1.1 to about 1.3, about 1.1 to about 1.25, about 1.1 to about 1.2, about 1.2 to about 1.5, about 1.2 to about 1.45, about 1.2 to about 1.4, about 1.2 to about 1.35, about 1.2 to about 1.3, or about 1.2 to about 1.25.

In one or more embodiments, the third etching process includes exposing the hard mask layer 120 to a reactive ion etch process. The hard mask layer 120 is exposed to one or more etchants during the third etching process. The etchant can be or include oxygen ($O_2$), chlorine ($Cl_2$), methane, helium, nitrogen ($N_2$), ions thereof, plasmas thereof, or any combination thereof. The hard mask layer 120 can be exposed to one or more etchants for time period from a minimum value of about 10 seconds, about 15 seconds, about 20 seconds, or about 30 seconds to a maximum value of about 45 seconds, about 60 seconds, about 75 seconds, about 90 seconds, about 100 seconds, about 120 seconds, or longer during the third etching process. For example, the hard mask layer 120 can be exposed to the etchant for about 10 seconds to about 120 seconds, about 30 seconds to about 120 seconds, or about 10 seconds to about 60 seconds during the third etching process. An exemplary process chamber for conducting the third etching process is the Sym3™ chamber commercially available from Applied Materials, Inc.

Figure 1E:
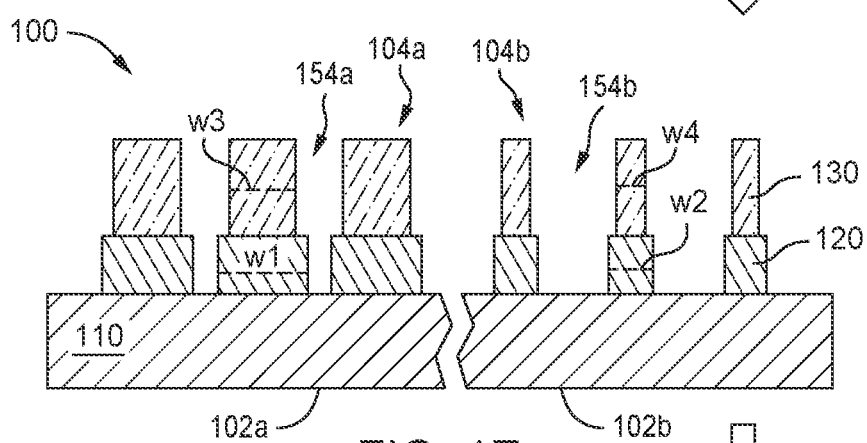

At operation 225, the silicon-containing layer 140 is removed or etched away from the planarization layer 130 during a fourth etching process or a polishing process, as depicted in FIG. 1E. In some examples, the polishing process can include a chemical mechanical planarization (CMP) process.

In some embodiments, the fourth etching process includes exposing the silicon-containing layer 140 to a reactive ion etch process. The silicon-containing layer 140 is exposed to one or more etchants during the fourth etching process. The etchant can be or include trifluoromethane, tetrafluoromethane, methane, oxygen ($O_2$), hydrogen ($H_2$), helium, nitrogen ($N_2$), argon, ions thereof, plasmas thereof, or any combination thereof. The silicon-containing layer 140 can be exposed to one or more etchants for time period from a minimum value of about 10 seconds, about 15 seconds, about 20 seconds, or about 30 seconds to a maximum value of about 45 seconds, about 60 seconds, about 75 seconds, about 90 seconds, about 100 seconds, about 120 seconds, or longer during the fourth etching process. For example, the silicon-containing layer 140 can be exposed to the etchant for about 10 seconds to about 120 seconds, about 30 seconds to about 120 seconds, or about 10 seconds to about 60 seconds during the fourth etching process. An exemplary process chamber for conducting the fourth etching process is the Sym3™ chamber commercially available from Applied Materials, Inc.

Figure 1F:
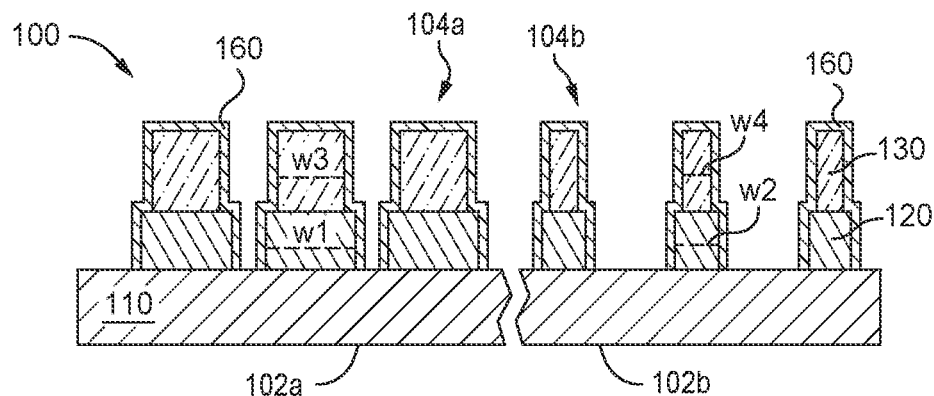

At operation 230, a silicon oxide layer 160 is deposited or otherwise formed on or over the planarization layer 130 and the hard mask layer 120 within the first set of features 104a and the second set of features 104b, as depicted in FIG. 1F. The silicon oxide layer 160 can be conformally deposited or formed over the first and second set of features 104a, 104b. The silicon oxide layer 160 can be an effective barrier layer or protective layer for the first and second set of features 104a, 104b during subsequent processing of the workpiece 100.

The silicon oxide layer 160 can be deposited or otherwise formed by an atomic layer deposition (ALD) process, a plasma-enhanced ALD process, a chemical vapor deposition (CVD) process, a plasma-enhanced CVD process, a pulsed-CVD process, a physical vapor deposition (PVD) process, a sputtering process, another deposition process, or any combination thereof. In one or more examples, the silicon oxide layer 160 is conformally deposited by thermal ALD by sequentially exposing the workpiece 100 to one or more silicon precursors and one or more oxidizing agents. Exemplary silicon precursors can be or include bis(tertbutylamino)silane (BTBAS), bis(diethylamino)silane (BDEAS), bis(dimethylamino)silane (BDMAS), or any combination thereof. Exemplary oxidizing agents can be or include oxygen ($O_2$), atomic oxygen, ozone, water, or any combination thereof.

The silicon oxide layer 160 can have a relatively thin thickness. The silicon oxide layer 160 can have a thickness from a minimum value of about 1 nm, about 2 nm, about 3 nm, about 5 nm, about 10 nm, about 15 nm, or about 20 nm to a maximum value of about 25 nm, about 30 nm, about 40 nm, about 50 nm, about 80 nm, about 100 nm, about 120 nm, about 150 nm, about 180 nm, about 200 nm, about 250 nm, about 300 nm, or greater. For example, the silicon oxide layer 160 can have a thickness of about 1 nm about 300 nm, about 1 nm about 200 nm, about 1 nm about 100 nm, about 1 nm about 50 nm, about 1 nm about 20 nm, about 5 nm about 300 nm, about 5 nm about 250 nm, about 5 nm about 200 nm, about 5 nm about 150 nm, about 5 nm about 120 nm, about 5 nm about 100 nm, about 5 nm about 80 nm, about 5 nm about 50 nm, about 5 nm about 30 nm, about 5 nm about 15 nm, about 15 nm about 300 nm, about 15 nm about 250 nm, about 15 nm about 200 nm, about 15 nm about 150 nm, about 15 nm about 120 nm, about 15 nm about 100 nm, about 15 nm about 80 nm, about 15 nm about 50 nm, about 15 nm about 30 nm, or about 15 nm about 20 nm.

Figure 1G:
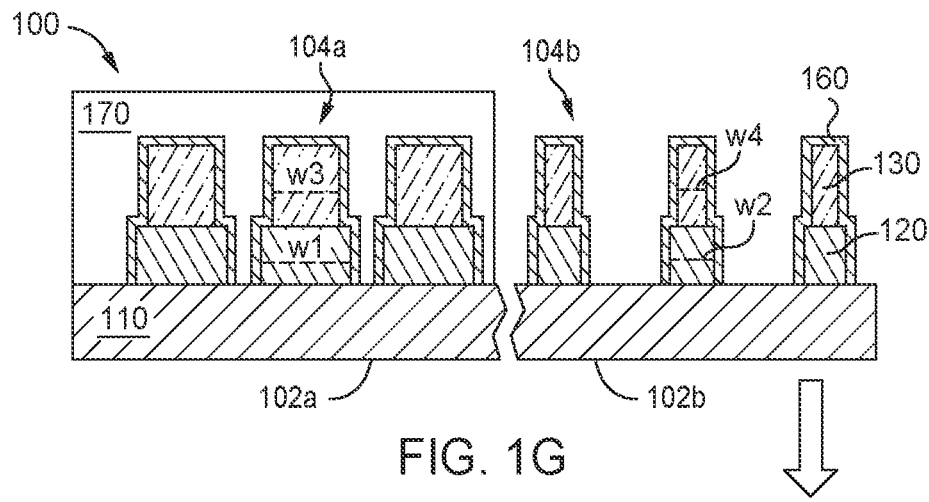

At operation 235, a protective layer 170 is deposited or otherwise formed on or over the first set of features 104a within the first portion 102a while leaving exposed the second set of features 104b within the second portion 102b, as depicted in FIG. 1G. As such, the thicker features are protected by the protective layer 170 and the thinner features are left exposed and opened. The protective layer 170 is disposed on or over the silicon oxide layer 160 within the first portion 102a. The protective layer 170 can be or include one or more photoresist (PR) materials. For example, the protective layer 170 can be or include one or more g-line PR materials, one or more i-line PR materials, one or more PR materials which develop at a wavelength of 248 nm, one or more PR materials which develop at a wavelength of 193 nm, one or more BARC materials, including organic BARC materials, or any combination thereof.

The protective layer 170 can have a thickness from a minimum value of about 20 nm, about 50 nm, about 100 nm, about 200 nm, about 350 nm, about 500 nm, or about 800 nm to a maximum value of about 1 µm, about 1.5 µm, about 2 µm, about 3 µm, about 5 µm, about 6 µm, about 8 µm, about 10 µm, about 15 µm, or greater. For example, the protective layer 170 can have a thickness of about 20 nm to about 15 µm, about 50 nm to about 10 µm, about 50 nm to about 8 µm, about 50 nm to about 5 µm, about 50 nm to about 3 µm, about 50 nm to about 2 µm, about 50 nm to about 1 µm, about 50 nm to about 500 nm, about 50 nm to about 300 nm, about 50 nm to about 200 nm, about 50 nm to about 100 nm, about 250 nm to about 10 µm, about 250 nm to about 8 µm, about 250 nm to about 5 µm, about 250 nm to about 3 µm, about 250 nm to about 2 µm, about 250 nm to about 1 µm, about 250 nm to about 500 nm, about 1 µm to about 10 µm, about 1 µm to about 8 µm, about 1 µm to about 5 µm, about 1 µm to about 3 µm, about 1 µm to about 2 µm, or about 1 µm to about 1.5 µm.

Figure 1H:
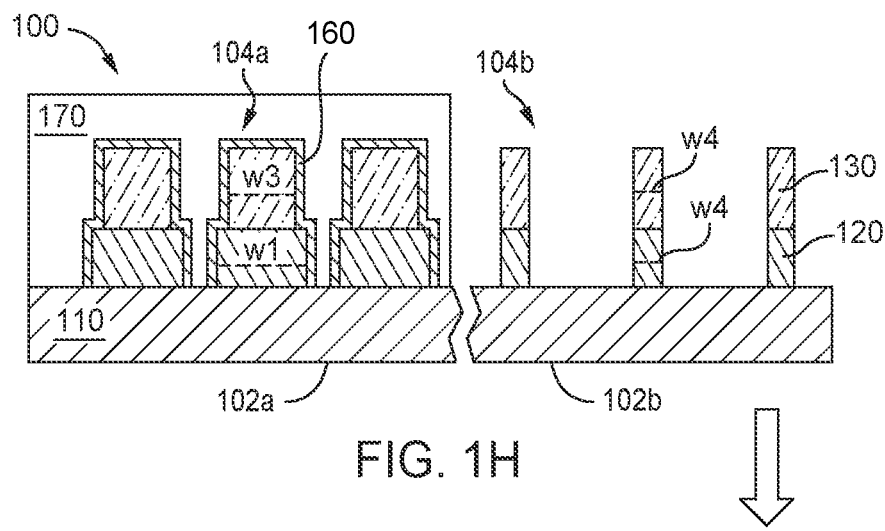

At operation 240, the workpiece 100 is exposed a fifth etching process. The second portion 102b of the workpiece 100 including the second set of features 104b can be exposed to the fifth etching process while etching or removing the silicon oxide layer 160 from the second set of features 104b and etching or removing a portion of the hard mask layer 120 within the second set of features 104b, as depicted in FIG. 1H. The hard mask layer 120 within the second set of features 104b is reduced in thickness and has the fourth width (w4) after the fifth etching process. Also, the planarization layer 130 within the second set of features 104b maintains the fourth width (w4) after the fifth etching process. As such, the hard mask layer 120 and the planarization layer 130 both within the second set of features 104b have the fourth width (w4) after the completion of the fifth etching process. The first portion 102b of the workpiece 100 can be exposed to the fifth etching process, however, the first set of features 104b and the silicon oxide layer 160 over the first set of features 104b are protected by the protective layer 170.

In one or more embodiments, the fifth etching process includes exposing the second set of features 104b to a wet clean process to etch or remove the silicon oxide layer 160, and then exposing the second set of features 104b to a dry etch process to etch or remove the portion of the hard mask layer 120 within the second set of features 104b. In some examples, the silicon oxide layer 160 can be exposed to a hydrofluoric acid solution during the wet clean process. The portion of the hard mask layer 120 within the second set of features 104b can be exposed to a reactive ion etch process. For example, the hard mask layer 120 can be exposed to one or more etchants during the dry etch process. The etchant can be or include oxygen ($O_2$), chlorine ($Cl_2$), methane, helium, nitrogen ($N_2$), ions thereof, plasmas thereof, or any combination thereof. The hard mask layer 120 can be exposed to one or more etchants for time period from a minimum value of about 10 seconds, about 15 seconds, about 20 seconds, or about 30 seconds to a maximum value of about 45 seconds, about 60 seconds, about 75 seconds, about 90 seconds, about 100 seconds, about 120 seconds, or longer during the dry etch process. For example, the hard mask layer 120 can be exposed to the etchant for about 10 seconds to about 120 seconds, about 30 seconds to about 120 seconds, or about 10 seconds to about 60 seconds during the dry etch process. An exemplary process chamber for conducting the dry etch process is the Sym3™ chamber commercially available from Applied Materials, Inc.

Figure 1I:
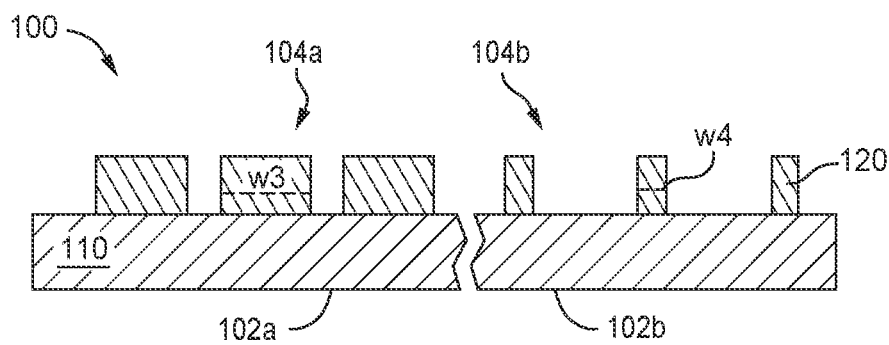

At operation 245, the workpiece 100 is exposed a sixth etching process. The first portion 102a of the workpiece 100 including the first set of features 104a can be exposed to the sixth etching process while etching or removing the protective layer 170 from the first set of features 104a, etching or removing the silicon oxide layer 160 from the first set of features 104a, etching or removing a portion of the hard mask layer 120 within the first set of features 104a, and etching or removing the planarization layer 130 within the first set of features 104a and the second set of features 104b, as depicted in FIG. 1I.

The hard mask layer 120 within the first set of features 104a is reduced in thickness and has the third width (w3) after the sixth etching process. Also, the planarization layer 130 within the first set of features 104a maintains the third width (w3) after the sixth etching process (not shown). As such, the hard mask layer 120 and the planarization layer 130 both within the first set of features 104a have the third width (w3) after the completion of the sixth etching process. Thereafter, the planarization layer 130 within the first set of features 104a can be removed or etched away. The second portion 102b of the workpiece 100 can be exposed to the sixth etching process to remove the planarization layer 130 from the second set of features 104b.

In one or more embodiments, the sixth etching process can include exposing the protective layer 170 within the first set of features 104a to a reactive ion etch process to remove the protective layer 170, then exposing the silicon oxide layer 160 within the first set of features 104a to a wet clean process to remove the silicon oxide layer 160, and then exposing the first set of features 104a to a dry etch process to remove a portion of the hard mask layer 120 within the first set of features 104a. In one or more examples, the protective layer 170 within the first set of features 104a can be exposed to one or more etchants during the reactive ion etch process. The etchant can be or include oxygen (O$_2$), chlorine (Cl$_2$), methane, helium, nitrogen (N$_2$), ions thereof, plasmas thereof, or any combination thereof. The protective layer 170 can be exposed to one or more etchants for time period from a minimum value of about 10 seconds, about 15 seconds, about 20 seconds, or about 30 seconds to a maximum value of about 45 seconds, about 60 seconds, about 75 seconds, about 90 seconds, about 100 seconds, about 120 seconds, or longer during the sixth etching process. For example, the protective layer 170 can be exposed to the etchant for about 10 seconds to about 120 seconds, about 30 seconds to about 120 seconds, or about 10 seconds to about 60 seconds during the sixth etching process. An exemplary process chamber for conducting the sixth etching process is the Sym3™ chamber commercially available from Applied Materials, Inc.

The silicon oxide layer 160 from the first set of features 104a can be exposed to a hydrofluoric acid solution during the wet clean process. In some examples, the hydrofluoric acid solution can be a dilute hydrogen fluoride (DHF) solution having a concentration of hydrogen fluoride of about 1% v/v, about 5% v/v, about 10% v/v, about 15% v/v, about 20% v/v, about 25% v/v, about 30% v/v, about 40% v/v, about 50% v/V, or greater and the remainder of water. For example, the DHF solution has a concentration of hydrogen fluoride of about 1% v/v to about 50% v/v, about 5% v/v to about 50% v/v, about 10% v/v to about 50% v/v, about 25% v/v to about 50% v/v, about 40% v/v to about 50% v/v, about 1% v/v to about 35% v/v, about 5% v/v to about 35% v/v, about 10% v/v to about 35% v/v, about 25% v/v to about 35% v/v, about 1% v/v to about 10% v/v, about 2% v/v to about 10% v/v, about 3% v/v to about 10% v/v, about 5% v/v to about 10% v/v, about 6% v/v to about 10% v/v, or about 8% v/v to about 10% v/v.

In some example, the portion of the hard mask layer 120 within the first set of features 104a is exposed to one or more etchants during the dry etch process. The etchant can be or include oxygen (O$_2$), chlorine (Cl$_2$), methane, helium, nitrogen (N$_2$), ions thereof, plasmas thereof, or any combination thereof. The hard mask layer 120 can be exposed to one or more etchants for time period from a minimum value of about 10 seconds, about 15 seconds, about 20 seconds, or about 30 seconds to a maximum value of about 45 seconds, about 60 seconds, about 75 seconds, about 90 seconds, about 100 seconds, about 120 seconds, or longer during the dry etch process. For example, the hard mask layer 120 can be exposed to the etchant for about 10 seconds to about 120 seconds, about 30 seconds to about 120 seconds, or about 10 seconds to about 60 seconds during the dry etch process. An exemplary process chamber for conducting the dry etch process is the Sym3™ chamber commercially available from Applied Materials, Inc.

In other embodiments described and discussed herein, a method for forming features on the workpiece 100 is provided and includes positioning the workpiece 100 containing the first set of features 104a having the first pattern 152a and the second set of features 104b having the second pattern 152b are formed in the silicon-containing layer 140, as depicted in FIG. 1D. Each of the first set of features 104a and the second set of features 104b contains the film stack 108 disposed on a substrate 110. The film stack 108 contains the hard mask layer 120 disposed on the substrate 110, the planarization layer 130 disposed on the hard mask layer 120, and the silicon-containing layer 140 disposed on the planarization layer 130. The hard mask layer 120 and the silicon-containing layer 140 in the first set of features 104a have the first width (w1). The hard mask layer 120 and the silicon-containing layer 140 in the second set of features 104b have the second width (w2). The planarization layer 130 in the first set of features 104a has the third width (w3). The planarization layer 130 in the second set of features 104b has the fourth width (w4). The second width (w2) is less than the first width (w1), the fourth width (w4) is less than the third width (w3), the third width (w3) is less than the first width (w1), and the fourth width (w4) is less than the second width (w2).

The method further includes removing the silicon-containing layer 140 from the planarization layer 130, as depicted in FIG. 1E, and depositing a silicon oxide layer 160 over the planarization layer 130 and the hard mask layer 120 within the first set of features 104a and the second set of features 104b, as depicted in FIG. 1F. The method further includes depositing a protective layer 170 over the first set of features 104a while leaving exposed the second set of features 104b, as depicted in FIG. 1G. The method also includes removing the silicon oxide layer 160 from the second set of features 104b and removing a portion of the hard mask layer 120 within the second set of features 104b. The hard mask layer 120 within the second set of features 104b has the fourth width (w4) after removing the portion of the hard mask layer 120, as depicted in FIG. 1H. The method further includes removing the protective layer 170 from the first set of features 104a, removing the silicon oxide layer 160 from the first set of features 104a, removing a portion of the hard mask layer 120 within the first set of features 104a, and removing the planarization layer 130 within the first set of features 104a and the second set of features 104b.

The hard mask layer 120 within the first set of features 104a has the third width (w3) after removing the portion of the hard mask layer 120.

Embodiments of the present disclosure further relate to any one or more of the following Examples 1-69:

1. A method for forming features on a workpiece, comprising: positioning the workpiece comprising a film stack disposed on a substrate, wherein the film stack comprises: a hard mask layer disposed on the substrate; a planarization layer disposed on the hard mask layer; a silicon-containing layer disposed on the planarization layer; and a patterned photoresist layer disposed on the silicon-containing layer, wherein the patterned photoresist layer comprises a first pattern having a first width and a second pattern having a second width less than the first width; etching the silicon-containing layer to form trenches extending through the silicon-containing layer and to the planarization layer during a first etching process, wherein the trenches are formed on exposed surfaces of the silicon-containing layer within spaces between the first and second patterns of the patterned photoresist layer, wherein a first set of features corresponding to the first pattern and a second set of features corresponding to the second pattern are formed in the silicon-containing layer, and wherein the silicon-containing layer has the first width in the first set of features and the second width in the second set of features after the first etching process; etching the planarization layer to further extend the trenches to the hard mask layer during a second etching process, wherein the first set of features corresponding to the first pattern and the second set of features corresponding to the second pattern are further formed in the planarization layer during the second etching process, and wherein the planarization layer has the first width in the first set of features and the second width in the second set of features after the second etching process; etching the hard mask layer to further extend the trenches to the substrate during a third etching process, wherein the first set of features corresponding to the first pattern and the second set of features corresponding to the second pattern are further formed in the hard mask layer during the third etching process, wherein the hard mask layer has the first width in the first set of features and the second width in the second set of features after the third etching process, wherein the planarization layer has a third width in the first set of features and a fourth width in the second set of features after the third etching process, and wherein the third width is less than the first width and the fourth width is less than the second width; removing the silicon-containing layer from the planarization layer during a fourth etching process or a polishing process; depositing a silicon oxide layer over the planarization layer and the hard mask layer within the first set of features and the second set of features; depositing a protective layer over the first set of features while leaving exposed the second set of features; exposing the second set of features to a fifth etching process to remove the silicon oxide layer from the second set of features and remove a portion of the hard mask layer within the second set of features, wherein the hard mask layer within the second set of features has the fourth width after the fifth etching process; and exposing the first set of features to a sixth etching process to remove the protective layer from the first set of features, remove the silicon oxide layer from the first set of features, remove a portion of the hard mask layer within the first set of features, and remove the planarization layer within the first set of features and the second set of features, wherein the hard mask layer within the first set of features has the third width after the sixth etching process.

2. The method according to example 1, wherein the first etching process comprises exposing the silicon-containing layer to a reactive ion etch process.

3. The method according to any one of examples 1-2, wherein the silicon-containing layer is exposed to an etchant during the first etching process, and wherein the etchant comprises trifluoromethane, tetrafluoromethane, methane, oxygen ($O_2$), hydrogen ($H_2$), helium, nitrogen ($N_2$), argon, ions thereof, plasmas thereof, or any combination thereof.

4. The method according to any one of examples 1-3, wherein the second etching process comprises exposing the planarization layer to a reactive ion etch process.

5. The method according to any one of examples 1-4, wherein the planarization layer is exposed to an etchant during the second etching process, and wherein the etchant comprises oxygen ($O_2$), nitrogen ($N_2$), chlorine ($Cl_2$), hydrogen bromide, methane, hydrogen ($H_2$), ions thereof, plasmas thereof, or any combination thereof.

6. The method according to any one of examples 1-5, wherein the third etching process comprises exposing the hard mask layer to a reactive ion etch process.

7. The method according to any one of examples 1-6, wherein the hard mask layer is exposed to an etchant during the third etching process, and wherein the etchant comprises oxygen ($O_2$), chlorine ($Cl_2$), methane, helium, nitrogen ($N_2$), ions thereof, plasmas thereof, or any combination thereof.

8a. The method according to any one of examples 1-7, wherein the fourth etching process comprises exposing the silicon-containing layer to a reactive ion etch process.

8b. The method according to any one of examples 1-8a, wherein the silicon-containing layer is exposed to an etchant during the fourth etching process, and wherein the etchant comprises trifluoromethane, tetrafluoromethane, methane, oxygen ($O_2$), hydrogen ($H_2$), helium, nitrogen ($N_2$), argon, ions thereof, plasmas thereof, or any combination thereof.

9. The method according to any one of examples 1-8b, wherein the fifth etching process comprises: exposing the second set of features to a wet clean process to remove the silicon oxide layer; and then exposing the second set of features to a dry etch process to remove the portion of the hard mask layer within the second set of features.

10. The method according to example 9, wherein the silicon oxide layer is exposed to a hydrofluoric acid solution during the wet clean process.

11. The method according to example 9, wherein the portion of the hard mask layer within the second set of features is exposed to a reactive ion etch process, wherein the hard mask layer is exposed to an etchant during the dry clean process, and wherein the etchant comprises oxygen ($O_2$), chlorine ($Cl_2$), methane, helium, nitrogen ($N_2$), ions thereof, plasmas thereof, or any combination thereof.

12. The method according to any one of examples 1-11, wherein the fifth etching process comprises: exposing the second set of features to a first dry clean process to remove the silicon oxide layer; and then exposing the second set of features to a second dry etch process to remove the portion of the hard mask layer within the second set of features.

13. The method according to example 12, wherein the silicon oxide layer is exposed to an etchant during the first dry clean process, and wherein the etchant comprises trifluoromethane, tetrafluoromethane, methane, oxygen ($O_2$), hydrogen ($H_2$), helium, nitrogen ($N_2$), argon, ions thereof, plasmas thereof, or any combination thereof.

14. The method according to example 12, wherein the portion of the hard mask layer within the second set of features is exposed to a reactive ion etch process, wherein the hard mask layer is exposed to an etchant during second dry clean process, and wherein the etchant comprises oxygen ($O_2$), chlorine ($Cl_2$), methane, helium, nitrogen ($N_2$), ions thereof, plasmas thereof, or any combination thereof.

15. The method according to any one of examples 1-14, wherein the sixth etching process further comprises: exposing the protective layer from the first set of features to a reactive ion etch process to remove the protective layer; and then exposing the silicon oxide layer from the first set of features to a wet clean process to remove the silicon oxide layer; and then exposing the first set of features to a dry etch process to remove the portion of the hard mask layer within the first set of features.

16. The method according to example 15, wherein the protective layer within the first set of features is exposed to an etchant during the reactive ion etch process, and wherein the etchant comprises oxygen ($O_2$), chlorine ($Cl_2$), methane, helium, nitrogen ($N_2$), ions thereof, plasmas thereof, or any combination thereof.

17. The method according to example 15, wherein the silicon oxide layer from the first set of features is exposed to a hydrofluoric acid solution during the wet clean process.

18. The method according to example 15, wherein the portion of the hard mask layer within the first set of features is exposed to an etchant during the dry etch process, and wherein the etchant comprises oxygen ($O_2$), chlorine ($Cl_2$), methane, helium, nitrogen ($N_2$), ions thereof, plasmas thereof, or any combination thereof.

19. The method according to any one of examples 1-18, wherein the planarization layer within the second set of features has the fourth width after the fifth etching process.

20. The method according to any one of examples 1-19, wherein the substrate comprises elemental silicon, silicon dioxide, doped-silicon oxide, fused silica, quartz, silicon carbide, germanium, silicon germanium, indium phosphide, gallium arsenide, gallium nitride, sapphire, diamond, dopants thereof, or any combination thereof.

21. The method according to any one of examples 1-20, wherein the hard mask layer comprises metallic chromium, titanium nitride, tantalum nitride, silicon nitride, titanium oxide, niobium oxide, alloys thereof, dopants thereof, or any combination thereof.

22. The method according to any one of examples 1-21, wherein the hard mask layer has a thickness of about 10 nm to about 300 nm.

23. The method according to any one of examples 1-22, wherein the planarization layer is an organic planarization layer (OPL).

24. The method according to any one of examples 1-23, wherein the planarization layer comprises a polymeric material, an oligomeric material, titanium oxide, silicon oxide, spin-on carbon, or any combination thereof.

25. The method according to any one of examples 1-24, wherein the planarization layer has a thickness of about 10 nm to about 500 nm.

26. The method according to any one of examples 1-25, wherein the silicon-containing layer is an anti-reflection coating (ARC) layer.

27. The method according to any one of examples 1-26, wherein the silicon-containing layer comprises silicon oxide or elemental silicon.

28. The method according to any one of examples 1-27, wherein the silicon-containing layer has a thickness of about 10 nm to about 250 nm.

29. The method according to any one of examples 1-28, wherein the patterned photoresist layer comprises one or more photoresist materials.

30. The method according to any one of examples 1-29, wherein the silicon oxide layer has a thickness of about 1 nm to about 200 nm.

31. The method according to any one of examples 1-30, wherein the silicon oxide layer is deposited by an atomic layer deposition process or a pulsed-chemical vapor deposition process.

32. The method according to any one of examples 1-31, wherein the silicon oxide layer is conformally deposited by atomic layer deposition by sequentially exposing the workpiece to a silicon precursor and an oxidizing agent.

33. The method according to example 32, wherein the silicon precursor comprises bis(tertbutylamino)silane (BTBAS), bis(diethylamino)silane (BDEAS), bis(dimethylamino)silane (BDMAS), or any combination thereof and the oxidizing agent comprises oxygen ($O_2$), atomic oxygen, ozone, water, or any combination thereof.

34. The method according to any one of examples 1-33, wherein the protective layer comprises a post block lithography layer.

35. The method according to any one of examples 1-34, wherein the protective layer comprises a g-line photoresist material, an i-line photoresist material, a photoresist material which develops at a wavelength of 248 nm, a photoresist material which develops at a wavelength of 193 nm, a bottom anti-reflectant coating (BARC) material, or any combination thereof.

36. The method according to any one of examples 1-35, wherein the protective layer has a thickness of about 50 nm to about 10 μm.

37. A method for forming features on a workpiece, comprising: positioning the workpiece comprising a first set of features having a first pattern and a second set of features having a second pattern are formed in the silicon-containing layer, wherein each of the first set of features and the second set of features comprises a film stack disposed on a substrate, and wherein the film stack comprises: a hard mask layer disposed on the substrate; a planarization layer disposed on the hard mask layer; and a silicon-containing layer disposed on the planarization layer, wherein: the hard mask layer and the silicon-containing layer in the first set of features have a first width; the hard mask layer and the silicon-containing layer in the second set of features have a second width; the second width is less than the first width; the planarization layer in the first set of features has a third width; the planarization layer in the second set of features has a fourth width; the fourth width is less than the third width; the third width is less than the first width; and the fourth width is less than the second width; removing the silicon-containing layer from the planarization layer; depositing a silicon oxide layer over the planarization layer and the hard mask layer within the first set of features and the second set of features; depositing a protective layer over the first set of features while leaving exposed the second set of features; removing the silicon oxide layer from the second set of features and removing a portion of the hard mask layer within the second set of features, wherein the hard mask layer within the second set of features has the fourth width after removing the portion of the hard mask layer; and removing the protective layer from the first set of features, removing the silicon oxide layer from the first set of features, removing a portion of the hard mask layer within the first set of features, and removing the planarization layer within the first set of features and the second set of features, wherein the hard mask layer within the first set of features has the fourth width after removing the portion of the hard mask layer.

38. The method according to example 37, the silicon-containing layer is exposed to a reactive ion etch process to remove the silicon-containing layer from the planarization layer.

39. The method according to example 37 or 38, wherein the silicon-containing layer is exposed to an etchant, and wherein the etchant comprises trifluoromethane, tetrafluoromethane, methane, oxygen ($O_2$), hydrogen ($H_2$), helium, nitrogen ($N_2$), argon, ions thereof, plasmas thereof, or any combination thereof.

40. The method according to any one of examples 37-39, wherein removing the silicon oxide layer from the second set of features and removing a portion of the hard mask layer within the second set of features further comprises: exposing the second set of features to a wet clean process to remove the silicon oxide layer; and then exposing the second set of features to a dry etch process to remove the portion of the hard mask layer within the second set of features.

41. The method according to example 40, wherein the silicon oxide layer is exposed to a hydrofluoric acid solution during the wet clean process.

42. The method according to example 40, wherein the portion of the hard mask layer within the second set of features is exposed to a reactive ion etch process, wherein the hard mask layer is exposed to an etchant during the dry clean process, and wherein the etchant comprises oxygen ($O_2$), chlorine ($Cl_2$), methane, helium, nitrogen ($N_2$), ions thereof, plasmas thereof, or any combination thereof.

43. The method according to any one of examples 37-42, wherein removing the silicon oxide layer from the second set of features and removing a portion of the hard mask layer within the second set of features further comprises: exposing the second set of features to a first dry clean process to remove the silicon oxide layer; and then exposing the second set of features to a second dry etch process to remove the portion of the hard mask layer within the second set of features.

44. The method according to example 43, wherein the silicon oxide layer is exposed to an etchant during the first dry clean process, and wherein the etchant comprises trifluoromethane, tetrafluoromethane, methane, oxygen ($O_2$), hydrogen ($H_2$), helium, nitrogen ($N_2$), argon, ions thereof, plasmas thereof, or any combination thereof.

45. The method according to example 43, wherein the portion of the hard mask layer within the second set of features is exposed to a reactive ion etch process, wherein the hard mask layer is exposed to an etchant during second dry clean process, and wherein the etchant comprises oxygen ($O_2$), chlorine ($Cl_2$), methane, helium, nitrogen ($N_2$), ions thereof, plasmas thereof, or any combination thereof.

46. The method according to any one of examples 37-45, wherein removing the protective layer from the first set of features, removing the silicon oxide layer from the first set of features, removing a portion of the hard mask layer within the first set of features, and removing the planarization layer within the first set of features and the second set of features, further comprises: exposing the protective layer from the first set of features to a reactive ion etch process to remove the protective layer; and then exposing the silicon oxide layer from the first set of features to a wet clean process to remove the silicon oxide layer; and then exposing the first set of features to a dry etch process to remove the portion of the hard mask layer within the first set of features.

47. The method according to example 46, wherein the protective layer within the first set of features is exposed to an etchant during the reactive ion etch process, and wherein the etchant comprises oxygen ($O_2$), chlorine ($Cl_2$), methane, helium, nitrogen ($N_2$), ions thereof, plasmas thereof, or any combination thereof.

48. The method according to example 46, wherein the silicon oxide layer from the first set of features is exposed to a hydrofluoric acid solution during the wet clean process.

49. The method according to example 46, wherein the portion of the hard mask layer within the first set of features is exposed to an etchant during the dry etch process, and wherein the etchant comprises oxygen ($O_2$), chlorine ($Cl_2$), methane, helium, nitrogen ($N_2$), ions thereof, plasmas thereof, or any combination thereof.

50. The method according to any one of examples 37-49, wherein the substrate comprises elemental silicon, silicon dioxide, doped-silicon oxide, fused silica, quartz, silicon carbide, germanium, silicon germanium, indium phosphide, gallium arsenide, gallium nitride, sapphire, diamond, dopants thereof, or any combination thereof.

51. The method according to any one of examples 37-50, wherein the hard mask layer comprises metallic chromium, titanium nitride, tantalum nitride, silicon nitride, titanium oxide, niobium oxide, alloys thereof, dopants thereof, or any combination thereof.

52. The method according to any one of examples 37-51, wherein the hard mask layer has a thickness of about 10 nm to about 300 nm.

53. The method according to any one of examples 37-52, wherein the planarization layer is an organic planarization layer (OPL).

54. The method according to any one of examples 37-53, wherein the planarization layer comprises a polymeric material, an oligomeric material, titanium oxide, silicon oxide, spin-on carbon, or any combination thereof.

55. The method according to any one of examples 37-54, wherein the planarization layer has a thickness of about 10 nm to about 500 nm.

56. The method according to any one of examples 37-55, wherein the silicon-containing layer is an anti-reflection coating (ARC) layer.

57. The method according to any one of examples 37-56, wherein the silicon-containing layer comprises silicon oxide or elemental silicon.

58. The method according to any one of examples 37-57, wherein the silicon-containing layer has a thickness of about 10 nm to about 250 nm.

59. The method according to any one of examples 37-58, wherein the silicon oxide layer has a thickness of about 1 nm to about 200 nm.

60. The method according to any one of examples 37-59, wherein the silicon oxide layer is deposited by an atomic layer deposition process or a pulsed-chemical vapor deposition process.

61. The method according to any one of examples 37-60, wherein the silicon oxide layer is conformally deposited by atomic layer deposition by sequentially exposing the workpiece to a silicon precursor and an oxidizing agent.

62. The method according to example 61, wherein the silicon precursor comprises bis(tertbutylamino)silane (BTBAS), bis(diethylamino)silane (BDEAS), bis(dimethylamino)silane (BDMAS), or any combination thereof and the oxidizing agent comprises oxygen ($O_2$), atomic oxygen, ozone, water, or any combination thereof.

63. The method according to any one of examples 37-62, wherein the protective layer comprises a post block lithography layer.

64. The method according to any one of examples 37-63, wherein the protective layer comprises a g-line photoresist material, an i-line photoresist material, a photoresist material which develops at a wavelength of 248 nm, a photoresist material which develops at a wavelength of 193 nm, a BARC material, or any combination thereof.

65. The method according to any one of examples 37-64, wherein the protective layer has a thickness of about 50 nm to about 10 μm.

66. A method for forming features on a workpiece, comprising: positioning the workpiece comprising a film stack disposed on a substrate, wherein the film stack comprises: a hard mask layer disposed on the substrate; a planarization layer disposed on the hard mask layer; a silicon-containing layer disposed on the planarization layer; and a patterned photoresist layer disposed on the silicon-containing layer, wherein the patterned photoresist layer comprises a first pattern having a first width and a second pattern having a second width less than the first width; etching the silicon-containing layer to form trenches extending through the silicon-containing layer and to the planarization layer during a first etching process, wherein the trenches are formed on exposed surfaces of the silicon-containing layer within spaces between the first and second patterns of the patterned photoresist layer, wherein a first set of features corresponding to the first pattern and a second set of features corresponding to the second pattern are formed in the silicon-containing layer, and wherein the silicon-containing layer has the first width in the first set of features and the second width in the second set of features after the first etching process; etching the planarization layer to further extend the trenches to the hard mask layer during a second etching process, wherein the first set of features corresponding to the first pattern and the second set of features corresponding to the second pattern are further formed in the planarization layer during the second etching process, and wherein the planarization layer has the first width in the first set of features and the second width in the second set of features after the second etching process; etching the hard mask layer to further extend the trenches to the substrate during a third etching process, wherein the first set of features corresponding to the first pattern and the second set of features corresponding to the second pattern are further formed in the hard mask layer during the third etching process, wherein the hard mask layer has the first width in the first set of features and the second width in the second set of features after the third etching process, wherein the planarization layer has a third width in the first set of features and a fourth width in the second set of features after the third etching process, and wherein the third width is less than the first width and the fourth width is less than the second width; removing the silicon-containing layer from the planarization layer during a fourth etching process or a polishing process; depositing a silicon oxide layer over the planarization layer and the hard mask layer within the first set of features and the second set of features; depositing a protective layer over the first set of features while leaving exposed the second set of features, wherein the protective layer comprises a g-line photoresist material, an i-line photoresist material, a photoresist material which develops at a wavelength of 248 nm, a photoresist material which develops at a wavelength of 193 nm, a BARC material, or any combination thereof; exposing the second set of features to a fifth etching process to remove the silicon oxide layer from the second set of features and remove a portion of the hard mask layer within the second set of features, wherein the hard mask layer within the second set of features has the fourth width after the fifth etching process; and exposing the first set of features to a sixth etching process to remove at least a portion of the hard mask layer within the first set of features, wherein the hard mask layer within the first set of features has the second width after the sixth etching process.

67. The method according to any one of examples 1-66, wherein the features and the workpiece are part of a device which comprises an augmented reality (AR) device, a virtual reality (VR) device, or both.

68. A device fabricated by the method according to any one of examples 1-66.

69. The device of example 68, wherein the device is an augmented reality (AR) device, a virtual reality (VR) device, or both.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated. As used herein, the term "about" refers to a +/−10% variation from the nominal value. It is to be understood that such a variation can be included in any value provided herein.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for forming features on a workpiece, comprising:
    positioning the workpiece comprising a film stack disposed on a substrate, wherein the film stack comprises:
        a hard mask layer disposed on the substrate;
        a planarization layer disposed on the hard mask layer;
        a silicon-containing layer disposed on the planarization layer; and
        a patterned photoresist layer disposed on the silicon-containing layer, wherein the patterned photoresist layer comprises a first pattern having a first width and a second pattern having a second width less than the first width;
    etching the silicon-containing layer to form trenches extending through the silicon-containing layer and to the planarization layer during a first etching process, wherein the trenches are formed on exposed surfaces of the silicon-containing layer within spaces between the first and second patterns of the patterned photoresist layer, wherein a first set of features corresponding to the first pattern and a second set of features corresponding to the second pattern are formed in the silicon-containing layer, and wherein the silicon-containing layer has the first width in the first set of features and the second width in the second set of features after the first etching process;

etching the planarization layer to further extend the trenches to the hard mask layer during a second etching process, wherein the first set of features corresponding to the first pattern and the second set of features corresponding to the second pattern are further formed in the planarization layer during the second etching process, and wherein the planarization layer has the first width in the first set of features and the second width in the second set of features after the second etching process;

etching the hard mask layer to further extend the trenches to the substrate during a third etching process, wherein the first set of features corresponding to the first pattern and the second set of features corresponding to the second pattern are further formed in the hard mask layer during the third etching process, wherein the hard mask layer has the first width in the first set of features and the second width in the second set of features after the third etching process, wherein the planarization layer has a third width in the first set of features and a fourth width in the second set of features after the third etching process, and wherein the third width is less than the first width and the fourth width is less than the second width;

removing the silicon-containing layer from the planarization layer during a fourth etching process or a polishing process;

depositing a silicon oxide layer over the planarization layer and the hard mask layer within the first set of features and the second set of features;

depositing a protective layer over the first set of features while leaving exposed the second set of features;

exposing the second set of features to a fifth etching process to remove the silicon oxide layer from the second set of features and remove a portion of the hard mask layer within the second set of features, wherein the hard mask layer within the second set of features has the fourth width after the fifth etching process; and exposing the first set of features to a sixth etching process to remove the protective layer from the first set of features, remove the silicon oxide layer from the first set of features, remove a portion of the hard mask layer within the first set of features, and remove the planarization layer within the first set of features and the second set of features, wherein the hard mask layer within the first set of features has the third width after the sixth etching process.

2. The method of claim 1, wherein the fifth etching process comprises:
exposing the second set of features to a wet clean process to remove the silicon oxide layer; and then
exposing the second set of features to a dry etch process to remove the portion of the hard mask layer within the second set of features.

3. The method of claim 2, wherein the silicon oxide layer is exposed to a hydrofluoric acid solution during the wet clean process.

4. The method of claim 2, wherein the portion of the hard mask layer within the second set of features is exposed to a reactive ion etch process, wherein the hard mask layer is exposed to an etchant during a dry clean process, and wherein the etchant comprises oxygen ($O_2$), chlorine ($Cl_2$), methane, helium, nitrogen ($N_2$), ions thereof, plasmas thereof, or any combination thereof.

5. The method of claim 1, wherein the fifth etching process comprises:
exposing the second set of features to a first dry clean process to remove the silicon oxide layer; and then
exposing the second set of features to a second dry etch process to remove the portion of the hard mask layer within the second set of features.

6. The method of claim 5, wherein the silicon oxide layer is exposed to an etchant during the first dry clean process, and wherein the etchant comprises trifluoromethane, tetrafluoromethane, methane, oxygen ($O_2$), hydrogen ($H_2$), helium, nitrogen ($N_2$), argon, ions thereof, plasmas thereof, or any combination thereof.

7. The method of claim 5, wherein the portion of the hard mask layer within the second set of features is exposed to a reactive ion etch process, wherein the hard mask layer is exposed to an etchant during a second dry clean process, and wherein the etchant comprises oxygen ($O_2$), chlorine ($Cl_2$), methane, helium, nitrogen ($N_2$), ions thereof, plasmas thereof, or any combination thereof.

8. The method of claim 1, wherein the sixth etching process further comprises:
exposing the protective layer from the first set of features to a reactive ion etch process to remove the protective layer; and then
exposing the silicon oxide layer from the first set of features to a wet clean process to remove the silicon oxide layer; and then
exposing the first set of features to a dry etch process to remove the portion of the hard mask layer within the first set of features.

9. The method of claim 8, wherein:
the protective layer within the first set of features is exposed to an etchant during the reactive ion etch process;
the etchant comprises oxygen ($O_2$), chlorine ($Cl_2$), methane, helium, nitrogen ($N_2$), ions thereof, plasmas thereof, or any combination thereof; and
the silicon oxide layer from the first set of features is exposed to a hydrofluoric acid solution during the wet clean process.

10. The method of claim 8, wherein the portion of the hard mask layer within the first set of features is exposed to an etchant during the dry etch process, and wherein the etchant comprises oxygen ($O_2$), chlorine ($Cl_2$), methane, helium, nitrogen ($N_2$), ions thereof, plasmas thereof, or any combination thereof.

11. The method of claim 1, wherein:
the silicon oxide layer is conformally deposited by atomic layer deposition by sequentially exposing the workpiece to a silicon precursor and an oxidizing agent;
the silicon precursor comprises bis(tertbutylamino)silane (BTBAS), bis(diethylamino)silane (BDEAS), bis(dimethylamino)silane (BDMAS), or any combination thereof; and
the oxidizing agent comprises oxygen ($O_2$), atomic oxygen, ozone, water, or any combination thereof.

12. A method for forming features on a workpiece, comprising:
positioning the workpiece comprising a first set of features having a first pattern and a second set of features having a second pattern are formed in a silicon-containing layer, wherein each of the first set of features and the second set of features comprises a film stack disposed on a substrate, and wherein the film stack comprises:
a hard mask layer disposed on the substrate;
a planarization layer disposed on the hard mask layer; and
the silicon-containing layer disposed on the planarization layer, wherein:
the hard mask layer and the silicon-containing layer in the first set of features have a first width;
the hard mask layer and the silicon-containing layer in the second set of features have a second width;
the second width is less than the first width;
the planarization layer in the first set of features has a third width;
the planarization layer in the second set of features has a fourth width;
the fourth width is less than the third width;
the third width is less than the first width; and
the fourth width is less than the second width;
removing the silicon-containing layer from the planarization layer;
depositing a silicon oxide layer over the planarization layer and the hard mask layer within the first set of features and the second set of features;
depositing a protective layer over the first set of features while leaving exposed the second set of features;
removing the silicon oxide layer from the second set of features and removing a portion of the hard mask layer within the second set of features, wherein the hard mask layer within the second set of features has the fourth width after removing the portion of the hard mask layer; and
removing the protective layer from the first set of features, removing the silicon oxide layer from the first set of features, removing a portion of the hard mask layer within the first set of features, and removing the planarization layer within the first set of features and the second set of features, wherein the hard mask layer within the first set of features has the third width after removing the portion of the hard mask layer.

13. The method of claim 12, wherein removing the silicon oxide layer from the second set of features and removing the portion of the hard mask layer within the second set of features further comprises:
exposing the second set of features to a wet clean process to remove the silicon oxide layer; and then
exposing the second set of features to a dry etch process to remove the portion of the hard mask layer within the second set of features.

14. The method of claim 13, wherein:
the silicon oxide layer is exposed to a hydrofluoric acid solution during the wet clean process;
the portion of the hard mask layer within the second set of features is exposed to a reactive ion etch process, wherein the hard mask layer is exposed to an etchant during the dry clean process;
the etchant comprises oxygen ($O_2$), chlorine ($Cl_2$), methane, helium, nitrogen ($N_2$), ions thereof, plasmas thereof, or any combination thereof.

15. The method of claim 12, wherein removing the silicon oxide layer from the second set of features and removing the portion of the hard mask layer within the second set of features further comprises:
exposing the second set of features to a first dry clean process to remove the silicon oxide layer; and then
exposing the second set of features to a second dry etch process to remove the portion of the hard mask layer within the second set of features.

16. The method of claim 15, wherein:
the silicon oxide layer is exposed to an etchant during the first dry clean process;
the etchant comprises trifluoromethane, tetrafluoromethane, methane, oxygen ($O_2$), hydrogen ($H_2$), helium, nitrogen ($N_2$), argon, ions thereof, plasmas thereof, or any combination thereof;
the portion of the hard mask layer within the second set of features is exposed to a reactive ion etch process;
the hard mask layer is exposed to an etchant during a second dry clean process; and
the etchant comprises oxygen ($O_2$), chlorine ($Cl_2$), methane, helium, nitrogen ($N_2$), ions thereof, plasmas thereof, or any combination thereof.

17. The method of claim 12, wherein removing the protective layer from the first set of features, removing the silicon oxide layer from the first set of features, removing the portion of the hard mask layer within the first set of features, and removing the planarization layer within the first set of features and the second set of features, further comprises:
exposing the protective layer from the first set of features to a reactive ion etch process to remove the protective layer; and then
exposing the silicon oxide layer from the first set of features to a wet clean process to remove the silicon oxide layer; and then
exposing the first set of features to a dry etch process to remove the portion of the hard mask layer within the first set of features.

18. The method of claim 17, wherein the protective layer within the first set of features is exposed to an etchant during the reactive ion etch process;
the etchant comprises oxygen ($O_2$), chlorine ($Cl_2$), methane, helium, nitrogen ($N_2$), ions thereof, plasmas thereof, or any combination thereof;
the silicon oxide layer from the first set of features is exposed to a hydrofluoric acid solution during the wet clean process;
the portion of the hard mask layer within the first set of features is exposed to an etchant during the dry etch process; and
the etchant comprises oxygen ($O_2$), chlorine ($Cl_2$), methane, helium, nitrogen ($N_2$), ions thereof, plasmas thereof, or any combination thereof.

19. The method of claim 12, wherein the silicon oxide layer is conformally deposited by atomic layer deposition by sequentially exposing the workpiece to a silicon precursor and an oxidizing agent, and wherein the silicon precursor comprises bis(tertbutylamino)silane (BTBAS), bis(diethylamino)silane (BDEAS), bis(dimethylamino)silane (BDMAS), or any combination thereof and the oxidizing agent comprises oxygen ($O_2$), atomic oxygen, ozone, water, or any combination thereof.

20. A method for forming features on a workpiece, comprising:
positioning the workpiece comprising a film stack disposed on a substrate, wherein the film stack comprises:
a hard mask layer disposed on the substrate;
a planarization layer disposed on the hard mask layer;
a silicon-containing layer disposed on the planarization layer; and
a patterned photoresist layer disposed on the silicon-containing layer, wherein the patterned photoresist layer comprises a first pattern having a first width and a second pattern having a second width less than the first width;

etching the silicon-containing layer to form trenches extending through the silicon-containing layer and to the planarization layer during a first etching process, wherein the trenches are formed on exposed surfaces of the silicon-containing layer within spaces between the first and second patterns of the patterned photoresist layer, wherein a first set of features corresponding to the first pattern and a second set of features corresponding to the second pattern are formed in the silicon-containing layer, and wherein the silicon-containing layer has the first width in the first set of features and the second width in the second set of features after the first etching process;

etching the planarization layer to further extend the trenches to the hard mask layer during a second etching process, wherein the first set of features corresponding to the first pattern and the second set of features corresponding to the second pattern are further formed in the planarization layer during the second etching process, and wherein the planarization layer has the first width in the first set of features and the second width in the second set of features after the second etching process;

etching the hard mask layer to further extend the trenches to the substrate during a third etching process, wherein the first set of features corresponding to the first pattern and the second set of features corresponding to the second pattern are further formed in the hard mask layer during the third etching process, wherein the hard mask layer has the first width in the first set of features and the second width in the second set of features after the third etching process, wherein the planarization layer has a third width in the first set of features and a fourth width in the second set of features after the third etching process, and wherein the third width is less than the first width and the fourth width is less than the second width;

removing the silicon-containing layer from the planarization layer during a fourth etching process or a polishing process;

depositing a silicon oxide layer over the planarization layer and the hard mask layer within the first set of features and the second set of features;

depositing a protective layer over the first set of features while leaving exposed the second set of features, wherein the protective layer comprises a g-line photoresist material, an i-line photoresist material, a photoresist material which develops at a wavelength of 248 nm, a photoresist material which develops at a wavelength of 193 nm, a bottom anti-reflectant coating (BARC) material, or any combination thereof;

exposing the second set of features to a fifth etching process to remove the silicon oxide layer from the second set of features and remove a portion of the hard mask layer within the second set of features, wherein the hard mask layer within the second set of features has the fourth width after the fifth etching process; and exposing the first set of features to a sixth etching process to remove at least a portion of the hard mask layer within the first set of features, wherein the hard mask layer within the first set of features has the third width after the sixth etching process.

* * * * *